US010502781B2

(12) United States Patent
Guo et al.

(10) Patent No.: US 10,502,781 B2
(45) Date of Patent: Dec. 10, 2019

(54) DETECTION CIRCUITS, DETECTION METHOD, AND ELECTRONIC SYSTEMS FOR I/O OUTPUT STATUS

(71) Applicants: Semiconductor Manufacturing International (Shanghai) Corporation, Shanghai (CN); Semiconductor Manufacturing International (Beijing) Corporation, Beijing (CN)

(72) Inventors: Zhen Ye Guo, Shanghai (CN); Zhen Jiang Su, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 86 days.

(21) Appl. No.: 15/874,371

(22) Filed: Jan. 18, 2018

(65) Prior Publication Data

US 2018/0203063 A1 Jul. 19, 2018

(30) Foreign Application Priority Data

Jan. 18, 2017 (CN) .......................... 2017 1 0040172

(51) Int. Cl.
*G01R 31/00* (2006.01)
*G01R 31/317* (2006.01)
(Continued)

(52) U.S. Cl.
CPC ... *G01R 31/31715* (2013.01); *G01R 31/3177* (2013.01); *G01R 31/31703* (2013.01);
(Continued)

(58) Field of Classification Search
None
See application file for complete search history.

(56) References Cited

U.S. PATENT DOCUMENTS

| 4,975,834 A | * | 12/1990 | Xu | ......................... G06F 15/161 712/28 |
| 9,417,640 B2 | * | 8/2016 | Chang | ..................... G05F 1/468 |

(Continued)

OTHER PUBLICATIONS

Y. Al-Alem, R. M. Shubair and A. Kishk, "Clock jitter correction circuit for high speed clock signals using delay units a nd time selection window," 2016 16th Mediterranean Microwave Symposium (MMS), Abu Dhabi, 2016, pp. 1-3. (Year: 2016).*

*Primary Examiner* — Daniel F. McMahon
(74) *Attorney, Agent, or Firm* — Anova Law Group, PLLC

(57) ABSTRACT

A detection circuit, a detection method, and an electronic system for detecting an I/O output status are provided. The detection circuit includes a comparison-window generating circuit configured to: detect an I/O data signal, generate a first single pulse signal, determining a first-time window, in response to a rising edge of the I/O data signal, and generate a second single pulse signal, determining a second-time window, in response to a falling edge of the I/O data signal. A first comparison circuit is configured to: receive the first single pulse signal, and compare the I/O drive signal with a preset high-level reference signal within the first time window to obtain a first comparison result. The second comparison circuit is configured to: receive the second single pulse signal, and compare the I/O drive signal with a preset low-level reference signal within the second time window to obtain a second comparison result.

20 Claims, 5 Drawing Sheets

(51) Int. Cl.
*H03K 17/687* (2006.01)
*H03K 5/24* (2006.01)
*G01R 31/3177* (2006.01)
*H03K 5/00* (2006.01)
*H03K 19/20* (2006.01)

(52) U.S. Cl.
CPC ......... *G01R 31/31725* (2013.01); *H03K 5/24* (2013.01); *H03K 17/687* (2013.01); *H03K 19/20* (2013.01); *H03K 2005/00013* (2013.01)

(56) References Cited

U.S. PATENT DOCUMENTS

| | | | |
|---|---|---|---|
| 2005/0270064 A1* | 12/2005 | Kawakami | H03K 19/0013 326/57 |
| 2012/0110374 A1* | 5/2012 | Brewerton | G06F 11/0739 714/5.11 |
| 2012/0212251 A1* | 8/2012 | Yanagishima | H03K 17/61 324/762.01 |
| 2013/0003905 A1* | 1/2013 | Jain | H03K 5/1534 375/360 |

* cited by examiner

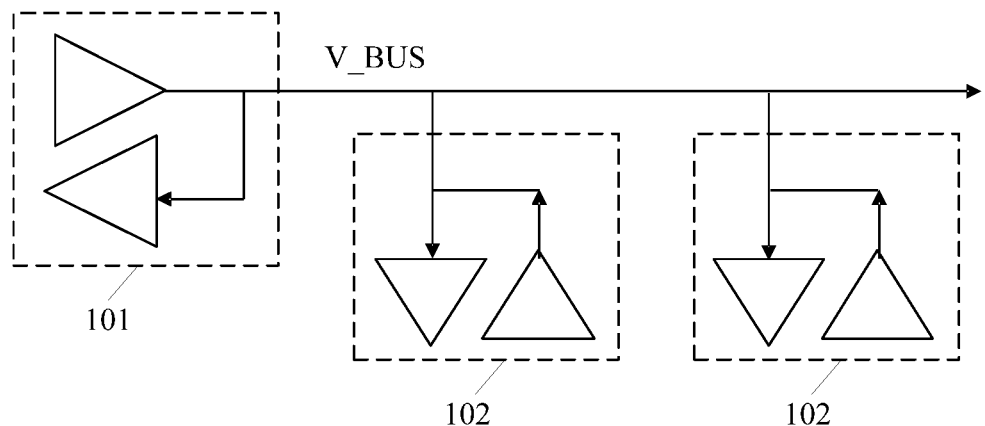
FIG. 1, Prior Art
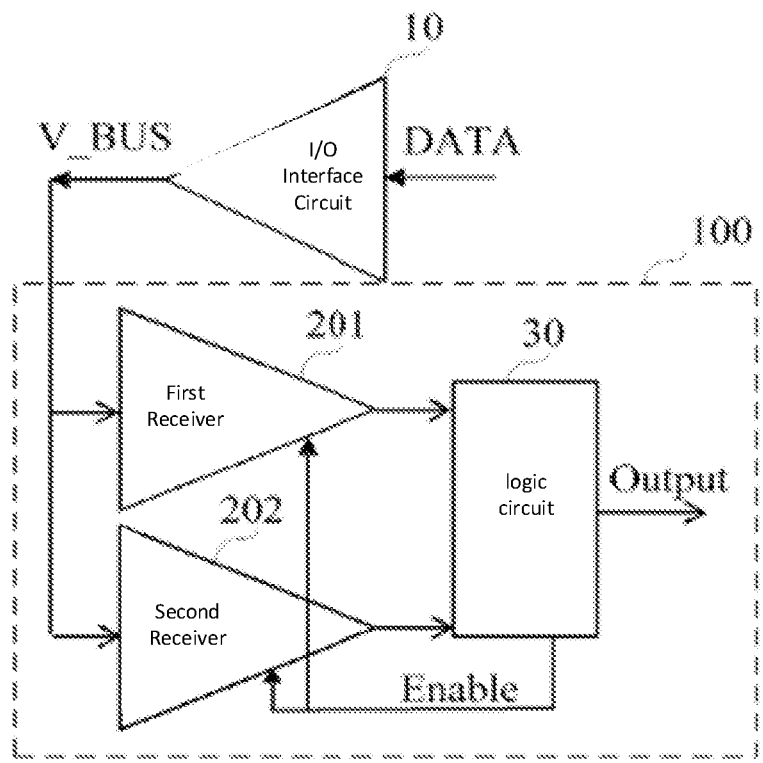
FIG. 2

DETECTION CIRCUITS, DETECTION METHOD, AND ELECTRONIC SYSTEMS FOR I/O OUTPUT STATUS

CROSS-REFERENCES TO RELATED APPLICATIONS

This application claims the priority of Chinese Patent Application No. 201710040172.5, filed on Jan. 18, 2017, the content of which is incorporated by reference in its entirety.

TECHNICAL FIELD

The present disclosure generally relates to the field of electronic circuit design and, more particularly, relates to detection circuit, detection method, and electronic system for detecting an output status of an input and output (I/O) interface circuit.

BACKGROUND

In modern electronic systems, a buffer circuit between the host and peripheral (or the master device and the slave device) is often referred to as an input and output (I/O) interface circuit. A conventional I/O output status detection circuit of the interface circuit includes a hysteresis comparison circuit and a logic circuit. The I/O output status detection circuit operates in response to an enable signal, and the enable signal comes from the logic circuit. The I/O output status detection circuit compares amplitude of an output signal of the I/O interface circuit with a threshold value of the hysteresis comparison circuit to determine whether or not the output status of the I/O interface circuit is abnormal.

However, the threshold voltage of the hysteresis comparison circuit in the conventional solution is affected by the circuit configuration so that the accuracy of the threshold voltage is not too high that will affect the detection accuracy of the I/O output status detection circuit. In addition, the I/O output status detection circuit operates in response to an external enable signal, which only detects the output status of the I/O interface circuit when the enable signal is valid. However, the abnormal status of the I/O data bus may occur at any time. The conventional I/O output status detection circuit may not be desirable for completely detecting the output status of the I/O interface circuit.

The disclosed devices and methods are directed to at least partially alleviate one or more problems set forth above and to solve other problems in the art.

SUMMARY

One aspect of the present disclosure provides a detection circuit for an I/O output status, including: a comparison-window generating circuit, a first comparison circuit, and a second comparison circuit. The comparison-window generating circuit is configured to: detect an I/O data signal, the I/O data signal being outputted via an I/O interface circuit as an I/O drive signal, generate a first single pulse signal in response to a rising edge of the I/O data signal, the first single pulse signal determining a first-time window, and generate a second single pulse signal in response to a falling edge of the I/O data signal, second single pulse signal determining a second-time window. The first comparison circuit is configured to: receive the first single pulse signal, and compare the I/O drive signal with a preset high-level reference signal within the first time window to obtain a first comparison result. The second comparison circuit is configured to: receive the second single pulse signal, and compare the I/O drive signal with a preset low-level reference signal within the second time window to obtain a second comparison result. The low level reference signal has an amplitude smaller than the high level reference signal, and the first comparison result and the second comparison result indicate a status of the I/O driving signal.

Another aspect of the present disclosure provides an electronic system, including: an I/O interface circuit; and a detection circuit for an I/O output status of the I/O interface circuit. The detection circuit includes a comparison-window generating circuit, a first comparison circuit, and a second comparison circuit. The comparison-window generating circuit is configured to: detect an I/O data signal, the I/O data signal being outputted via an I/O interface circuit as an I/O drive signal, generate a first single pulse signal in response to a rising edge of the I/O data signal, the first single pulse signal determining a first-time window, and generate a second single pulse signal in response to a falling edge of the I/O data signal, second single pulse signal determining a second-time window. The first comparison circuit is configured to: receive the first single pulse signal, and compare the I/O drive signal with a preset high-level reference signal within the first time window to obtain a first comparison result. The second comparison circuit is configured to: receive the second single pulse signal, and compare the I/O drive signal with a preset low-level reference signal within the second time window to obtain a second comparison result. The low level reference signal has an amplitude smaller than the high level reference signal, and the first comparison result and the second comparison result indicate a status of the I/O driving signal.

Another aspect of the present disclosure provides method for detecting an I/O output status, including detecting an I/O data signal, the I/O data signal being outputted via an I/O interface circuit as an I/O drive signal, generating a first single pulse signal in response to a rising edge of the I/O data signal, the first single pulse signal determining a first-time window, and generating a second single pulse signal in response to a falling edge of the I/O data signal, second single pulse signal determining a second-time window; comparing the I/O drive signal with a preset high-level reference signal within the first time window to obtain a first comparison result; and comparing the I/O drive signal with a preset low-level reference signal within the second time window to obtain a second comparison result. The low level reference signal has an amplitude smaller than the high level reference signal, and the first comparison result and the second comparison result indicate a status of the I/O driving signal.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 1 is a schematic diagram of a master-slave electronic system;

FIG. 2 is a block diagram of an exemplary I/O output status detection circuit according to various disclosed embodiments of the present disclosure;

DETAILED DESCRIPTION

Figure 3:
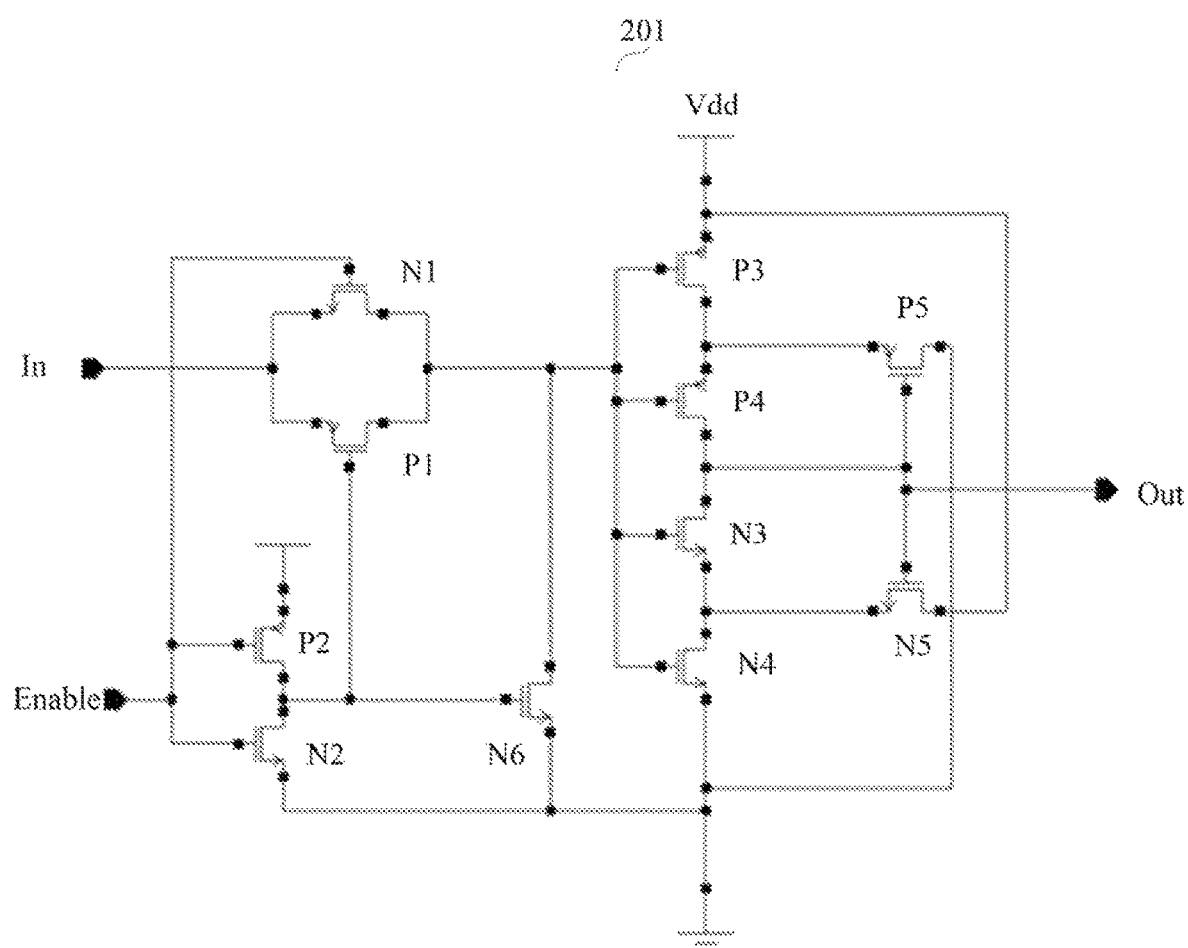
FIG. 3 is a circuit diagram of an exemplary first receiver shown in FIG. 2.

Reference will now be made in detail to exemplary embodiments of the disclosure, which are illustrated in the accompanying drawings. Wherever possible, the same reference numbers will be used throughout the drawings to refer to the same or like parts.

FIG. 1 is a schematic diagram of a master-slave electronic system. For example, considering the bandwidth and performance of a system, a master device 101 may connect to a plurality of slave devices 102 via an I/O data bus. Referring to FIG. 1, the master device 101 drives two slave devices 102. On such a multipoint-driven I/O data bus, it is necessary that the master device 101 communicates with only one of the slave devices 102 at any time. During the communication, when the master device 101 serves as an input terminal, one of the slave devices 102 may serve as an output terminal, and when one of the slave devices 102 serves as an input port, the master device 101 may serve as an output terminal. When the master device 101 and the slave devices 102 do not meet one-to-one communication, or if there is a process defect or a system problem, the system may crash or fail. The state of the I/O data bus will be abnormal. The above-mentioned abnormal states of the I/O data bus may be directly determined by detecting the level of the output voltage V_BUS of the I/O interface circuit in the master device 101 and/or in the slave devices 102.

As such, the master and slave devices are driven and used to transmit data via the I/O data bus. This requires detection of the status of the I/O data bus. For example, the level of the output voltage of the I/O interface circuit in the master and/or slave devices needs to be detected.

As used herein, the term "I/O output status detection circuit" refers to a detection circuit for an output status of an I/O interface circuit, or an output status detection circuit of an I/O interface circuit.

FIG. 2 is a block diagram of an I/O output status detection circuit. For example, the I/O output status detection circuit 100 shown in FIG. 2 may include a first receiver 201, a second receiver 202, and a logic circuit 30. Where the logic circuit 30 may output an enable signal (Enable), based on a preset frequency, to the enable terminals of the first receiver 201 and the second receiver 202. A drive signal (V_BUS) is fed to the first receiver 201 and the second receiver 202. A data signal (DATA) is shifted to the drive signal (V_BUS) via an I/O driver 10 so that the drive signal (V_BUS) has a better drive capability. The data signal (DATA) may be a data signal outputted from the I/O data bus or a portion of the output data signal.

The first receiver 201 shown in FIG. 3 may include a transfer gate composed of an NMOS transistor N1 and a PMOS transistor P1, an inverter composed of an NMOS transistor N2 and a PMOS transistor P2, a pull-down NMOS transistor N6 (which may be used to prevent a floating state at an output terminal of the transfer gate), and a hysteresis comparison circuit formed by the NMOS transistors N3, N4, N5 and the PMOS transistors P3, P4, and P5. An input terminal (In) of the first receiver 201 receives the drive signal (V_BUS). When the enable terminal (Enable) of the first receiver 201 is at a logic high, the drive signal (V_BUS) is transmitted to the hysteresis comparison circuit and the comparison function of the first receiver 201 is enabled. The hysteresis comparison circuit has a high threshold voltage and a low threshold voltage. The hysteresis comparison circuit may output a logic high when the voltage level of the drive signal (V_BUS) is higher than the high threshold voltage, and the hysteresis comparison circuit may output a logic low level when the voltage level of the drive signal (V_BUS) is lower than the low threshold voltage, or vice versa. When the level of the drive signal (V_BUS) is between the high threshold voltage and the low threshold voltage, the output status of the hysteresis comparison circuit is maintained constant.

The circuit configuration of the first receiver 201 and the second receiver 202 is substantially the same except that they have different high threshold voltages and low threshold voltages, for example, the high threshold voltage of the second receiver 202 may be higher the high threshold voltage of the first receiver 201, the low threshold voltage of the second receiver 202 is higher than the low threshold voltage of the first receiver 201, and may even be further higher than the high threshold voltage of the first receiver 201. Thus, when the voltage level of the drive signal (V_BUS) is lower than the low threshold voltage of the first receiver 201 or higher than the high threshold voltage of the second receiver 202, the logic circuit 30 will detect the transition of the logic level, whereby the detection of the level state of the drive signal V_BUS may be completed to further detect the state of the I/O data bus.

Since the comparison function of the first receiver 201 and the second receiver 202 is triggered by the enable signal (Enable) at a preset frequency, the I/O output status detection circuit operates in a "query" detection mode. The detection of the abnormal state of the I/O data bus may be missing so that this kind of detection is incomplete. In addition, the detection accuracy of the I/O output status detection circuit 100 is limited by the high threshold voltage and the low threshold voltage of the first receiver 201 and the second receiver 202. The accuracy of the high threshold voltage and the low threshold voltage of the first receiver 201 is limited by, for example, the aspect ratio of the PMOS transistor P5 and the NMOS transistor N5 in the first receiver 201, which is not high due to the limitation of the process. Similarly, the high threshold voltage and the low threshold voltage of the first receiver 202 are not high in accuracy. Therefore, the above-described technical solution has a defect that the detection is incomplete and the detection accuracy is not high.

The embodiments of the present disclosure provide an I/O output status detection circuit which is self-enabled and adopts the "interrupt" detection mode, and an interrupt signal is a data signal of an I/O data bus. In particular, the detection of the status of an output terminal of the I/O interface circuit may be coupled to the I/O data bus, according to the rising and falling edges of the data signal of the I/O data bus. The detection process may be in a complete manner without missing, e.g., the abnormal state.

Figure 4:
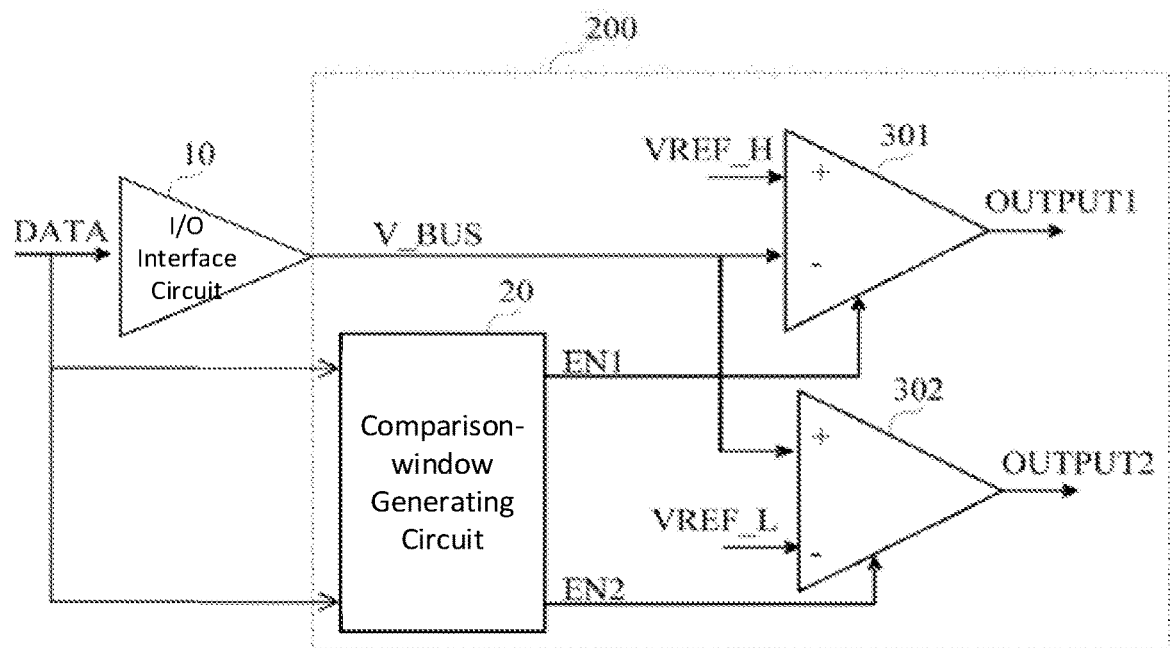
FIG. 4 is a block diagram of another exemplary I/O output status detection circuit according to various disclosed embodiments of the present disclosure.

An I/O output status detection circuit 200 according to an embodiment of the present disclosure is shown in FIG. 4. An I/O data signal (DATA) is shifted to an I/O drive signal (V_BUS) via an I/O interface circuit 10.

The I/O output status detection circuit 200 may include a comparison window generation circuit 20, a first comparison circuit 301, and a second comparison circuit 302.

The comparison-window generating circuit 20 is configured to detect the I/O data signal (DATA), and the comparison-window generating circuit 20 generates a first single pulse signal (EN1) and a second single pulse signal (EN2). The first single pulse signal (EN1) defines a first-time window in response to a rising edge of the I/O data signal (DATA), and the second single pulse signal (EN2) defines a second-time window in response to the falling edge of the I/O data signal (DATA).

The first comparison circuit 301 receives the first single pulse signal (EN1) and is configured to compare the I/O drive signal (V_BUS) and the preset high-level reference signal (VREF_H) within the first-time window to obtain a first comparison result (OUTPUT1).

The second comparison circuit 302 receives the second single pulse signal (EN2) and is configured to compare the I/O drive signal (V_BUS) and the preset low-level reference signal (VREF_L) within the second-time window to obtain a second comparison result (OUTPUT2). The amplitude of the low-level reference signal (VREF_L) is less than the amplitude of the high-level reference signal (VREF_H). The first comparison result (OUTPUT1) and the second comparison result (OUTPUT2) indicate that the state of the I/O drive signal (V_BUS).

The comparison circuit compares the two signals by comparing the amplitudes of the two signals. The first single pulse signal (EN1) and the second single pulse signal (EN2) may be the single pulse which may transit from a logic low to a logic high, but is not limited thereto, or transit from a logic high to a logic low, which depends on the specific circuit configuration of the first comparison circuit 301 and the second comparison circuit 302. If not specifically set, the first single pulse signal (EN1) and the second single pulse signal (EN2) in the embodiment of the present disclosure are the single pulses which transit from a logic low to a logic high.

In an embodiment, the first single pulse signal (EN1) may act on an enable terminal or an output terminal of the first comparison circuit 301, and the second single pulse signal (EN2) may also act on an enable terminal or a power supply terminal of the comparison circuit 302, which are not particularly limited in the present disclosure.

The amplitudes of the high-level reference signal (VREF_H) and the low-level reference signal (VREF_L) are preset, both of which are relative level amplitudes and do not refer to absolute level amplitudes. In the present embodiment, the high-level reference signal (VREF_H) represents a minimum value that may be allowed when the I/O driving signal (V_BUS) is a logic high, and the low-level reference signal (VREF_L) indicates a maximum value that may be allowed when the I/O driving signal (V_BUS) is low.

In the present embodiment, if the I/O data signal (DATA) is at a logic high, the comparison window generation circuit 20 will generate the first single pulse signal (EN1). The first comparison circuit 301 compares the I/O driving signal (V_BUS) with the high-level reference signal (VREF_H) within the first-time window. If the amplitude of the I/O driving signal (V_BUS) is greater than the high-level reference signal (VREF_H), the first comparison result (OUTPUT1) indicates that the output status of the I/O interface circuit 10 is normal, otherwise, it is abnormal. If the I/O data signal (DATA) is a logic low level, the comparison-window generating circuit 20 generates the second single pulse signal (EN2). The comparison circuit compares the I/O driving signal (V_BUS) and the low-level reference signal (VREF_L) within the second-time window. If the amplitude of the I/O driving signal (V_BUS) is smaller than the low-level reference signal (VREF_L), the second comparison result (OUTPUT2) indicates that the I/O interface circuit 10 outputs a normal state, otherwise it is abnormal.

Compared with the conventional I/O output status detection circuit, the I/O output status detection circuit 200 according to the present embodiment does not need an external enable. The I/O output status detection circuit 200 according to the present embodiment turns on the detection function upon detecting the rising or falling edge of the I/O data signal (DATA), which prevents the missing detection. It may also save power by using the "interrupt" detection mode.

In various embodiments of the present disclosure, the I/O output status detection circuit 200 may further include a first voltage dividing circuit (not labeled) and/or a second voltage dividing circuit (not labeled).

The first voltage dividing circuit is configured to divide the supply voltage of the I/O interface circuit 10 at a first division ratio to obtain the high-level reference signal (VREF_H). The second voltage dividing circuit is configured to divide the supply voltage (not labeled) of the I/O interface circuit 10 at a second division ratio to obtain the low-level reference signal (VREF_L). The second division ratio is less than the first division ratio.

Further, the first voltage dividing circuit and/or the second voltage dividing circuit may use voltage divider components. In order to ensure the detection accuracy of the I/O output status detection circuit 200 according to the present embodiment, the voltage accuracy of the high-level reference signal (VREF_H) and/or the low-level reference signal (VREF_L) may be further improved by using a high-accuracy divider component, for example, a precision resistor with a precision of one thousandth or more, but not limited thereto. In addition, the first voltage dividing circuit and/or the second voltage dividing circuit may be divided at a different division ratio by the supply voltage of the I/O interface circuit 10, which is easy to implement.

In an embodiment, the amplitude of the high-level reference signal (VREF_H) may be set equal to 90% of the supply voltage of the I/O interface circuit 10, and the amplitude of the low-level reference signal (VREF_L) may be set equal to 10% of the supply voltage of the I/O interface circuit 10, but is not limited thereto.

In one embodiment, the I/O output status detection circuit 200 for detecting the status of the I/O interface circuit 10 will be described in detail with reference to FIGS. 5 to 8.

Figure 5:
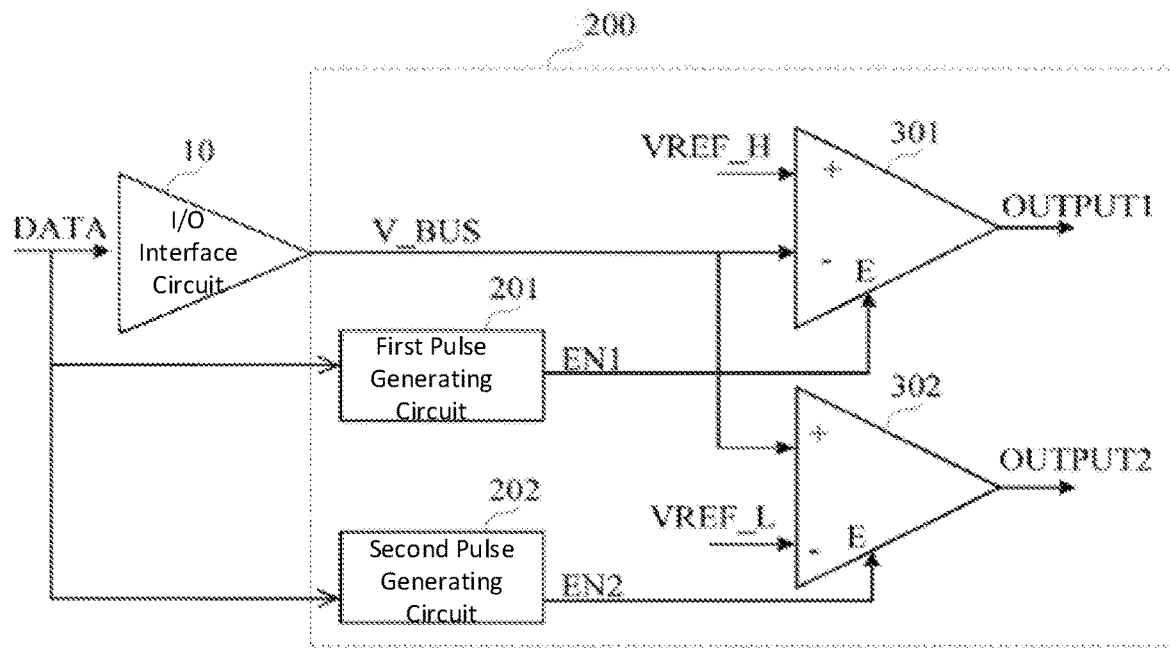
FIG. 5 is a block diagram of another exemplary I/O output status detection circuit according to various disclosed embodiments of the present disclosure.

Referring to FIG. 5, the comparison-window generating circuit 20 may include a first pulse generating circuit 201 and a second pulse generating circuit 202.

Further, the first pulse generating circuit 201 is configured to generate a first single pulse signal (EN1) whose active level is a logic high in response to a rising edge of an I/O data signal (DATA). The single pulse signal (EN1) is applied to an enable terminal of the first comparison circuit 301. The second pulse generation circuit 202 is configured to generate a second single pulse signal (EN2) whose active level is a logic low in response to a falling edge of the I/O data signal (DATA). The second single pulse signal (EN2) is applied to an enable terminal of the second comparison circuit 302.

Figure 6:
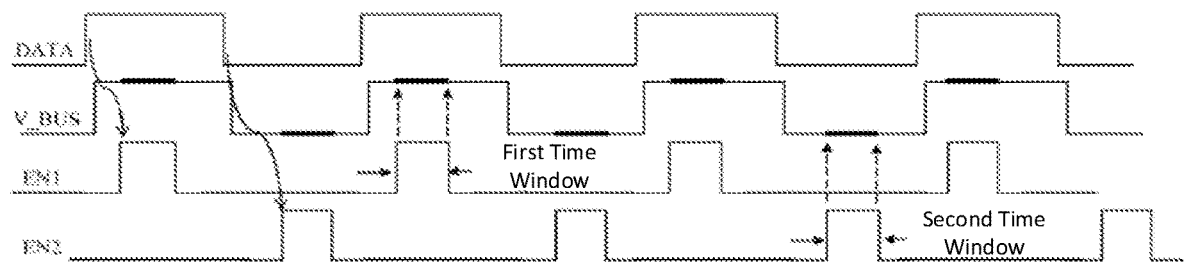
FIG. 6 is the schematic waveforms of an I/O output status detection circuit shown in FIG. 5 according to various disclosed embodiments of the present disclosure.

Referring to FIGS. 5 and 6, there is a small delay (not labeled) between an I/O drive signal (V_BUS) and the I/O data signal (DATA). When the rising edge of the I/O data signal (DATA) arrives, the first pulse generating circuit 201 generates the first single pulse signal (EN1). When the logic level of the first single pulse is active, that is, the first-time window, the first comparison circuit 301 performs a comparison operation. There is a certain delay between the rising edge of the first pulse signal and the rising edge of the I/O data signal (DATA), providing a certain amount of time margin for the establishment of the I/O data signal (DATA), such that the I/O data signal (DATA) has been established within the first-time window. There is a delay between the falling edge of the first pulse signal and the falling edge of the I/O data signal (DATA). It is ensured that the I/O data signal (DATA) remains active within the first-time window.

Similarly, when the falling edge of the I/O data signal (DATA) arrives, the second pulse generating circuit 202 generates the second single pulse signal (EN2). When the logic of the second single pulse is active high, that is, the second-time window, the second comparison circuit 302 performs a comparison operation. There is a delay between the rising edge of the first pulse signal and the falling edge of the I/O data signal (DATA), and a delay between the falling edge of the first pulse signal and the falling edge of the I/O data signal (DATA).

The respective delays involved in FIG. 6 are related to the configuration of the first pulse generating circuit 201 and the second pulse generating circuit 202, and are not shown in FIG. 6 for simplicity. Further, the amount of each of the above delays is not particularly limited in the present embodiment.

Figure 7:
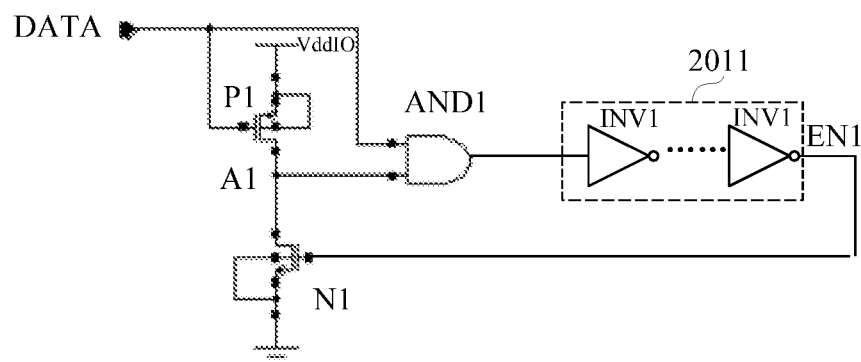
FIG. 7 is a circuit diagram of an exemplary first pulse generating circuit shown in FIG. 5 according to various disclosed embodiments of the present disclosure.

Referring to FIG. 7, the first pulse generating circuit 201 may include a first switch circuit P1, a second switch circuit N1, a first AND gate AND1, and a first delay chain circuit 2011.

The first switch circuit P1 is turned on when a control terminal is at a logic low and is turned off when the control terminal is at a logic high. The first switch circuit P1 has a control terminal receiving the I/O data signal (DATA), a first terminal receiving a supply voltage (VddIO) of an I/O interface circuit 10, and a second terminal coupled to a first switch node A1. The first switch circuit P1 may be a PMOS transistor as shown in FIG. 7, and other switching devices such as triodes and transfer gates, which may be appropriately adjusted to meet the circuit requirements.

The second switch circuit N1 is turned on when a control terminal is at a logic high and is turned off when the control terminal is at a logic low. The second switch circuit N1 has a control terminal receiving the first single pulse signal (EN1), a first terminal coupled to the first switch node A1, and a second terminal grounded. The second switch circuit N1 may be an NMOS transistor as shown in FIG. 7, and other switching devices such as triodes and transfer gates which may be appropriately adjusted to meet the circuit requirements.

A first input terminal of the first AND gate AND1 is coupled to the first switch node A1, and a second input terminal of the first AND gate AND1 receives the I/O data signal DATA. An output terminal of the first AND gate AND1 outputs a first logic signal (not labeled). The first AND gate AND1 may use an MOS transistor, may be implemented by an AND gate chip, or may be obtained by a digital logic control unit. The first AND gate is not particularly limited in the present embodiment.

The first delay chain circuit 2011 is configured to delay the first logic signal to obtain the first single pulse signal (EN1).

Further, the first delay chain circuit 2011 may include an even-numbered cascaded inverters INV1.

The first delay chain circuit 2011 is not limited to the above-mentioned even-numbered inverter INV1, and any other circuits or combination of circuits may be provided as long as the first logic signal may be delayed, however, it is necessary to consider the level logic of the first single pulse signal (EN1) in an embodiment.

When the I/O data signal (DATA) is at a logic low, the first switch circuit P1 is turned on. The first switch node A1 is a logic high, the first AND gate AND1 outputs the first logic signal is at a logic low, the first single pulse signal (EN1) is at a logic low, and the second switch circuit N1 is turned off. When the I/O data signal (DATA) becomes a logic high, the first switch circuit P1 is turned off and the first logic signal is at a logic high and is subjected to an even-numbered cascaded inverters INV1 (provided a delay t1). The first single pulse signal (EN1) goes to a logic high, and the second switch circuit N1 is turned on. It may be determined that the delay between the rising edge of the first single pulse signal (EN1) and the rising edge of the I/O data signal (DATA) is equal to t1. When the second switch circuit N1 is turned on, the first switch node A1 becomes a logic low, and the first logic signal becomes a logic low, which pass through several even-numbered cascades inverters to transit the first single pulse signal (EN1) to a logic low. Therefore, a pulse width of the single pulse signal (EN1) is equal to t1.

Thus, the first delay chain circuit 2011 may adjust the pulse width of the first single pulse signal (EN1) and the delay between the first single pulse signal (EN1) (shown in FIG. 6) and the I/O data signal (DATA) by adjusting the number of the inverters INV1.

Figure 8:
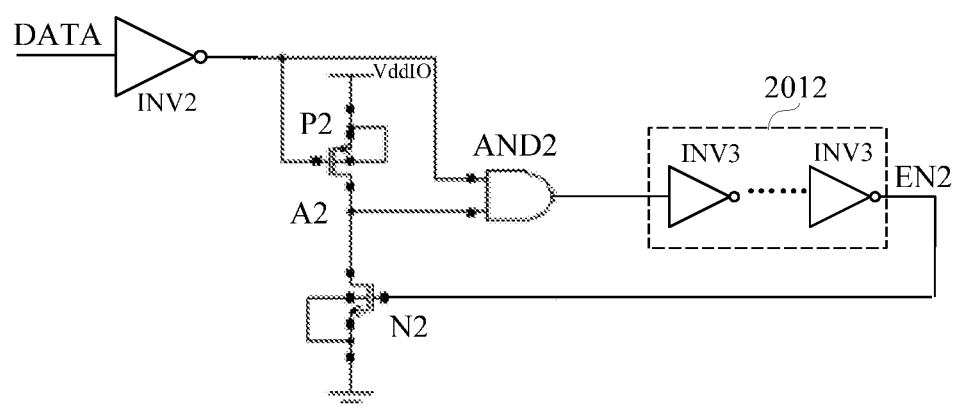
FIG. 8 is a circuit diagram of an exemplary second pulse generating circuit shown in FIG. 5 according to various disclosed embodiments of the present disclosure.

Referring to FIG. 8, the second pulse generating circuit 202 may include an inverter circuit INV2, a third switch circuit P2, a fourth switch circuit N2, a second AND gate AND2, and a second delay chain circuit 2012.

The inverting circuit INV2 is configured to invert the I/O data signal (DATA). In particular, the inverting circuit INV2 may be an inverter shown in FIG. 8, but not limited thereto. The inverter circuit INV2 may be a circuit or a combination of circuits that may realize an inverter function.

The third switch circuit P2 is turned on when a control terminal is at a logic low and is turned off when the control terminal is at a logic high. The third switch circuit P2 has the control terminal receiving the I/O data signal (DATA), a first terminal receiving the supply voltage (VddIO) of the I/O interface circuit 10, and a second terminal coupled to a second switch node A2. The third switch circuit P2 may be a PMOS transistor as shown in FIG. 8, or other switching devices such as triodes and transfer gates, and the control strategy may be appropriately adjusted to meet the circuit requirements.

The fourth switch circuit N2 is turned on when a control terminal is at a logic high and is turned off when the control terminal is at a logic low. The fourth switch circuit N2 has the control terminal receiving the second single pulse signal (EN2), a first terminal coupled to the second switch node A2, and a second terminal grounded. The fourth switch circuit N2 may be an NMOS transistor as shown in FIG. 8, or other switching devices such as triodes and transfer gates, and the control strategy may be appropriately adjusted to meet the circuit requirements.

A first terminal of the second AND gate AND2 is coupled to the second switch node A2 and a second terminal of the second AND gate AND2 receives the I/O data signal (DATA). An output terminal of AND2 outputs a second logic signal (not labeled).

The second delay chain circuit 2012 is configured to delay the second logic signal to obtain the second single pulse signal (EN2).

In an embodiment, the second delay chain circuit 2012 may include an even-numbered concatenated inverters INV3.

For more information about the third switch circuit P2, the fourth switch circuit N2, the second AND gate AND2, and the second delay chain circuit 2012, please refer to the foregoing description of FIG. 7, which will not be described here.

In the embodiment of the present disclosure, the I/O interface circuit 10 may include an I/O drive circuit (not labeled) configured to increase the driving capability of the I/O data signal (DATA) to obtain the I/O Drive signal (V_BUS).

The embodiment of the present disclosure also discloses an electronic system that may include an I/O output status detection circuit 200 for an I/O interface circuit 10 and an I/O interface circuit output status.

The "high-level" in this context refers to a level range that may be recognized as a digital signal "1", and "low-level" refers to a level that may be recognized as a digital signal "0". These are relative values, and no specific restrictions are required on the specific level range.

A technical problem solved by the present disclosure is how to realize the complete detection of the output status of an I/O interface circuit.

In one embodiment, an I/O output status detection circuit, where the I/O output is an I/O drive signal, includes a comparison-window generating circuit, a first comparison circuit, and a second comparison circuit.

The comparison-window generating circuit is configured to generate a first single pulse signal in response to a rising edge of an I/O data signal which defines a first-time window, and a second single pulse signal in response to a falling edge of the I/O data signal which defines a second-time window.

The first comparison circuit is configured to receive the first single pulse signal and compare the I/O drive signal and a preset high-level reference signal within the first time window to obtain a first comparison result.

The second comparison circuit is configured to receive the second single pulse signal and compare the I/O drive signal and a preset low-level reference signal within the second time window to obtain a second comparison result. The amplitude of the low-level reference signal is smaller than the amplitude of the high-level reference signal, and the first comparison result and the second comparison result indicate the status of the I/O driving signal.

In some embodiments, the comparison-window generating circuit includes a first pulse generating circuit and a second pulse generation circuit.

The first pulse generating circuit is configured to generate the first single pulse signal with an active logic high in response to the rising edge of the I/O data signal, which is applied to the enable terminal of the first comparison circuit.

The second pulse generation circuit is configured to generate the second single pulse signal with an active logic low in response to the falling edge of the I/O data signal, which is applied to the enable terminal of the second comparison circuit.

In some embodiments, the first pulse generating circuit includes a first switch circuit, a second switch circuit, a first AND gate, and a first delay chain circuit.

The first switch circuit has a control terminal and configured to turn on in response to a logic low at the control terminal and to turn off in response to a logic high at the control terminal, where the control terminal receives the I/O data signal, a first terminal of the first switch circuit receives a supply voltage of the I/O interface circuit, and a second terminal of the first switch circuit is coupled to a first switch node.

The second switch circuit has a control terminal and is configured to turn on in response to a logic high at the control terminal and to turn off in response to a logic low at the control terminal, where the control terminal receives the first single pulse signal, a first terminal of the second switch circuit is coupled to the first switch node, and a second terminal of the second switch circuit is grounded.

The first AND gate has a first input terminal coupled to the first switch node, a second input terminal receiving the I/O data signal, and an output terminal outputting a first logic signal.

The first delay chain circuit is configured to delay the first logic signal to obtain the first single pulse signal.

In some embodiments, the first delay chain circuit includes even-numbered cascaded inverters.

In some embodiments, the second pulse generating circuit includes an inverting circuit, a third switch circuit, a fourth switch circuit, a second AND gate, and a second delay chain circuit.

The inverting circuit is configured to invert the I/O data signal.

The third switch circuit has a control terminal and is configured to turn on in response to a logic low at the control terminal and to turn off in response to a logic high at the control terminal, where the control terminal receives the I/O data signal, a first terminal of the third switch circuit is coupled to receive the supply voltage of the I/O interface circuit, and a second terminal of the third switch circuit is coupled to a second switch node.

The fourth switch circuit has a control terminal and is configured to turn on in response to a logic high at the control terminal and to turn off in response to a logic low at the control terminal, where the control terminal receives the second single pulse signal, a first terminal of the fourth switch circuit is coupled to the second switch node, and a second terminal of the fourth switch circuit is grounded.

The second AND gate has a first terminal coupled to the second switch node, a second terminal receiving the I/O data signal, and an output terminal outputting a second logic signal.

The second delay chain circuit is configured to delay the second logic signal to obtain the second single pulse signal.

In some embodiments, the second delay chain circuit includes even-numbered cascaded inverters.

In some embodiments, the I/O output status detection circuit further includes an I/O drive circuit configured to increase the driving capability of the I/O data signal to obtain the I/O drive signal.

In some embodiments, the I/O output status detection circuit further includes a first voltage dividing circuit configured to divide the supply voltage of the I/O interface circuit at a first division ratio to obtain the high-level reference signal.

In some embodiments, the I/O output status detection circuit further includes a second voltage dividing circuit configured to divide the supply voltage of the I/O interface circuit at a second division ratio to obtain the low-level reference signal, the second division ratio is less than the first division ratio.

The present disclosure also provides an electronic system includes an I/O interface circuit and the I/O output status detection circuit.

Unlike conventional level-shifter circuit, the disclosed I/O output status detection circuit may include a comparison-window generating circuit, a first comparison circuit, and a second comparison circuit. The comparison-window generating circuit generates a first single pulse signal in response to a rising edge of an I/O data signal and a second single pulse signal in response to a falling edge of the I/O data signal. The first single pulse signal and the second single pulse signal define a first-time window and a second-time window, respectively. The I/O data signal shift to the I/O drive signal via the I/O interface circuit. The first comparison circuit receives the first single pulse signal and compares the I/O drive signal and a preset high-level reference signal within the first time window to obtain a first comparison result. The second comparison circuit receives the second single pulse signal and compares the I/O drive signal and a preset low-level reference signal within the second time window to obtain a second comparison result, where the amplitude of the low-level reference signal is smaller than the amplitude of the high-level reference signal, and the first comparison result and the second comparison result indicate the status of the I/O driving signal. Compared to the conventional circuits, there is no need of external enable signal in the I/O output status detection circuit according to the embodiments of the present disclosure. Once the rising or falling edge of the I/O data signal is detected, detection of the output status of the I/O interface circuit is enabled by the internal enable signal.

Further, the I/O output status detection circuit may further include a first voltage dividing circuit to obtain the high-level reference signal and a second voltage dividing circuit to obtain the low-level reference signal. The first voltage dividing circuit and the second voltage dividing circuit have different division ratios. The voltage accuracy of the high-level reference signal (VREF_H) and/or the low-level reference signal (VREF_L) may be further improved by using a high-accuracy divider component to divide the power supply voltage of the I/O interface circuit with different division ratio.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A detection circuit for an I/O output status, comprising:
   a comparison-window generating circuit, configured to:
   detect an I/O data signal, wherein the I/O data signal is outputted via an I/O interface circuit as an I/O drive signal,
   generate a first single pulse signal in response to a rising edge of the I/O data signal, the first single pulse signal determining a first-time window and being delayed with respect to the rising edge of the I/O data signal, and
   generate a second single pulse signal in response to a falling edge of the I/O data signal, the second single pulse signal determining a second-time window and being delayed with respect to the falling edge of the I/O data signal;
   a first comparison circuit, configured to:
   receive the first single pulse signal, and
   compare the I/O drive signal with a preset high-level reference signal within the first time window to obtain a first comparison result; and
   a second comparison circuit, configured to:
   receive the second single pulse signal, and
   compare the I/O drive signal with a preset low-level reference signal within the second time window to obtain a second comparison result,
   wherein the low level reference signal has an amplitude smaller than the high level reference signal, and the first comparison result and the second comparison result indicate a status of the I/O driving signal.

2. The detection circuit according to claim 1, wherein the comparison-window generating circuit comprises:
   a first pulse generating circuit, configured to generate the first single pulse signal with an active level of a logic high in response to the rising edge of the I/O data signal, wherein the first single pulse signal is applied to an enable terminal of the first comparison circuit; and
   a second pulse generation circuit, configured to generate the second single pulse signal with an active level of a logic low in response to the falling edge of the I/O data signal, wherein the second single pulse signal is applied to an enable terminal of the second comparison circuit.

3. The detection circuit according to claim 2, wherein the first pulse generating circuit comprises:
   a first switch circuit, having a control terminal being turned on in response to the logic low at the control terminal and being turned off in response to the logic high at the control terminal, wherein the control terminal receives the I/O data signal, a first terminal of the first switch circuit receives a supply voltage of the I/O interface circuit, and a second terminal of the first switch circuit is coupled to a first switch node;
   a second switch circuit, having a control terminal being turned on in response to the logic high at the control terminal and being turned off in response to the logic low at the control terminal, wherein the control terminal receives the first single pulse signal, a first terminal of the second switch circuit is coupled to the first switch node, and a second terminal of the second switch circuit is grounded;
   a first AND gate, having a first input terminal coupled to the first switch node, a second input terminal receiving the I/O data signal, and an output terminal outputting a first logic signal; and
   a first delay chain circuit, configured to delay the first logic signal to obtain the first single pulse signal.

4. The detection circuit according to claim 3, wherein the first delay chain circuit comprises even-numbered cascaded inverters.

5. The detection circuit according to claim 2, wherein the second pulse generating circuit comprises:
   an inverting circuit, configured to invert the I/O data signal;
   a third switch circuit, having a control terminal being turned on in response to the logic low at the control terminal and being turned off in response to the logic high at the control terminal, wherein the control terminal receives the I/O data signal, a first terminal of the third switch circuit is coupled to receive a supply voltage of the I/O interface circuit, and a second terminal of the third switch circuit is coupled to a second switch node;
   a fourth switch circuit, having a control terminal being turned on in response to the logic high at the control terminal and being turned off in response to the logic low at the control terminal, wherein the control terminal receives the second single pulse signal, a first terminal of the fourth switch circuit is coupled to the second switch node, and a second terminal of the fourth switch circuit is grounded;

a second AND gate, having a first terminal coupled to the second switch node, a second terminal receiving the I/O data signal, and an output terminal outputting a second logic signal; and a second delay chain circuit, configured to delay the second logic signal to obtain the second single pulse signal.

6. The detection circuit according to claim 5, wherein the second delay chain circuit comprises even-numbered cascaded inverters.

7. The detection circuit according to claim 1, wherein the I/O interface circuit comprises an I/O drive circuit, configured to increase a driving capability of the I/O data signal to obtain the I/O drive signal.

8. The detection circuit according to claim 1, further comprising:
a first voltage dividing circuit, configured to divide a supply voltage of the I/O interface circuit at a first division ratio to obtain the high-level reference signal.

9. The detection circuit according to claim 8, further comprising:
a second voltage dividing circuit, configured to divide the supply voltage of the I/O interface circuit at a second division ratio to obtain the low-level reference signal, the second division ratio being less than the first division ratio.

10. An electronic system, comprising:
an I/O interface circuit; and
a detection circuit for an I/O output status of the I/O interface circuit, the detection circuit comprising:
a comparison-window generating circuit, configured to:
detect an I/O data signal, wherein the I/O data signal is outputted via the I/O interface circuit as an I/O drive signal,
generate a first single pulse signal in response to a rising edge of the I/O data signal, the first single pulse signal determining a first-time window and being delayed with respect to the rising edge of the I/O data signal, and
generate a second single pulse signal in response to a falling edge of the I/O data signal, the second single pulse signal determining a second-time window and being delayed with respect to the falling edge of the I/O data signal;
a first comparison circuit, configured to:
receive the first single pulse signal, and
compare the I/O drive signal with a preset high-level reference signal within the first time window to obtain a first comparison result; and
a second comparison circuit, configured to:
receive the second single pulse signal, and
compare the I/O drive signal with a preset low-level reference signal within the second time window to obtain a second comparison result,
wherein the low level reference signal has an amplitude smaller than the high level reference signal, and the first comparison result and the second comparison result indicate a status of the I/O driving signal.

11. The system according to claim 10, wherein the comparison-window generating circuit comprises:

a first pulse generating circuit, configured to generate the first single pulse signal with an active level of a logic high in response to the rising edge of the I/O data signal, wherein the first single pulse signal is applied to an enable terminal of the first comparison circuit; and a second pulse generation circuit, configured to generate the second single pulse signal with an active level of a logic low in response to the falling edge of the I/O data signal, wherein the second single pulse signal is applied to an enable terminal of the second comparison circuit.

12. The system according to claim 11, wherein the first pulse generating circuit comprises:
a first switch circuit, having a control terminal being turned on in response to the logic low at the control terminal and being turned off in response to the logic high at the control terminal, wherein the control terminal receives the I/O data signal, a first terminal of the first switch circuit receives a supply voltage of the I/O interface circuit, and a second terminal of the first switch circuit is coupled to a first switch node;

a second switch circuit, having a control terminal being turned on in response to the logic high at the control terminal and being turned off in response to the logic low at the control terminal, wherein the control terminal receives the first single pulse signal, a first terminal of the second switch circuit is coupled to the first switch node, and a second terminal of the second switch circuit is grounded;

a first AND gate, having a first input terminal coupled to the first switch node, a second input terminal receiving the I/O data signal, and an output terminal outputting a first logic signal; and a first delay chain circuit, configured to delay the first logic signal to obtain the first single pulse signal.

13. The system according to claim 12, wherein the first delay chain circuit comprises even-numbered cascaded inverters.

14. The system according to claim 11, wherein the second pulse generating circuit comprises:
an inverting circuit, configured to invert the I/O data signal;

a third switch circuit, having a control terminal being turned on in response to the logic low at the control terminal and being turned off in response to the logic high at the control terminal, wherein the control terminal receives the I/O data signal, a first terminal of the third switch circuit is coupled to receive a supply voltage of the I/O interface circuit, and a second terminal of the third switch circuit is coupled to a second switch node;

a fourth switch circuit, having a control terminal being turned on in response to the logic high at the control terminal and being turned off in response to the logic low at the control terminal, wherein the control terminal receives the second single pulse signal, a first terminal of the fourth switch circuit is coupled to the second switch node, and a second terminal of the fourth switch circuit is grounded;

a second AND gate, having a first terminal coupled to the second switch node, a second terminal receiving the I/O data signal, and an output terminal outputting a second logic signal; and a second delay chain circuit, configured to delay the second logic signal to obtain the second single pulse signal.

15. The system according to claim 14, wherein the second delay chain circuit comprises even-numbered cascaded inverters.

16. A method for detecting an I/O output status, comprising:
- detecting an I/O data signal, wherein the I/O data signal is outputted via an I/O interface circuit as an I/O drive signal, generating a first single pulse signal in response to a rising edge of the I/O data signal, the first single pulse signal determining a first-time window and being delayed with respect to the rising edge of the I/O data signal, and generating a second single pulse signal in response to a falling edge of the I/O data signal, the second single pulse signal determining a second-time window and being delayed with respect to the falling edge of the I/O data signal;
- comparing the I/O drive signal with a preset high-level reference signal within the first time window to obtain a first comparison result; and
- comparing the I/O drive signal with a preset low-level reference signal within the second time window to obtain a second comparison result, wherein the low level reference signal has an amplitude smaller than the high level reference signal, and the first comparison result and the second comparison result indicate a status of the I/O driving signal.

17. The method according to claim 16, further comprising:
- generating the first single pulse signal with an active level of a logic high in response to the rising edge of the I/O data signal, wherein the first single pulse signal is applied to an enable terminal of the first comparison circuit; and
- generating the second single pulse signal with an active level of a logic low in response to the falling edge of the I/O data signal, wherein the second single pulse signal is applied to an enable terminal of the second comparison circuit.

18. The method according to claim 16, wherein the I/O interface circuit comprises an I/O drive circuit, configured to increase a driving capability of the I/O data signal to obtain the I/O drive signal.

19. The method according to claim 16, further comprising:
- dividing a supply voltage of the I/O interface circuit at a first division ratio to obtain the high-level reference signal.

20. The method according to claim 19, further comprising:
- dividing the supply voltage of the I/O interface circuit at a second division ratio to obtain the low-level reference signal, the second division ratio being less than the first division ratio.

* * * * *